United States Patent [19]

Welling

[11] 4,151,638
[45] May 1, 1979

[54] HERMETIC GLASS ENCAPSULATION FOR SEMICONDUCTOR DIE AND METHOD

[75] Inventor: John R. Welling, Scottsdale, Ariz.

[73] Assignee: Motorola, Inc., Schaumburg, Ill.

[21] Appl. No.: 828,588

[22] Filed: Aug. 29, 1977

[51] Int. Cl.² ............................................. B01J 17/00
[52] U.S. Cl. ........................................ 29/588; 29/589; 29/590
[58] Field of Search ...................... 29/576 S, 588, 589, 29/590

[56] References Cited

U.S. PATENT DOCUMENTS

| | | | |
|---|---|---|---|
| 3,542,550 | 11/1970 | Conrad | 29/588 |
| 3,577,633 | 5/1971 | Homma | 29/588 |
| 3,726,006 | 4/1973 | Muckelroy | 29/588 |
| 3,742,599 | 7/1973 | Desmond | 29/588 |

Primary Examiner—W. Tupman
Attorney, Agent, or Firm—Eugene A. Parsons

[57] ABSTRACT a semiconductor die having bump type contact areas thereon with film strip leads bonded thereto and fired glass encapsulating only the active side of the die and the bump contact areas. The method of encapsulation includes bonding the film strip leads to the bumps of the die, coating the bumps and active area with unfired glass and firing the glass at a temperature generally below 450° C. The method also includes bonding the film strip leads to the bumps and firing the glass simultaneously or firing the glass and remelting glass covering the bumps to bond the leads to the bumps through the fired glass.

2 Claims, 5 Drawing Figures

HERMETIC GLASS ENCAPSULATION FOR SEMICONDUCTOR DIE AND METHOD

BACKGROUND OF THE INVENTION

It is essential to hermetically seal semiconductor dies from the surrounding atmosphere so that they are impervious to water vapor and other moisture in the air. If the metallization on the semiconductor die active surface is allowed to contact water vapor or other moisture, or other atmospheric gases, the operation of the active circuitry can be effected, the life of the IC circuit can be effected, etc. To prevent the contact of moisture and gases with the metallization on the semiconductor die, it is common to encapsulate the die so as to hermetically seal it from the atmosphere.

In most prior art devices, semiconductor dies are hermetically sealed by using ceramic or metal enclosures which are relatively expensive and complicated to manufacture. Also, substantial labor is required in mounting the die within the ceramic or metal enclosure and connecting external leads thereto. In one prior art device disclosed in U.S. Pat. No. 3,325,586, entitled "Circuit Element Totally Encapsulated in Glass", issued June 13, 1967, semiconductor dies are sandwiched between two flat plates, which may be constructed of metal or ceramic, with an unfired glass material and the entire sandwich is fired to completely encapsulate the die between the two plates. While this apparatus is somewhat of an improvement over the prior packages, it still requires considerable labor and effort in positioning the plates and placing the unfired glass material around the die therebetween.

SUMMARY OF THE INVENTION

The present invention pertains to a hermetically sealed semiconductor die and method of sealing wherein only the active surface and lead contact areas are encapsulated with glass and leads are bonded to the contact areas prior to firing the glass, simultaneous with firing the glass, or subsequent to firing the glass. Since only the active area of the semiconductor die is encapsulated, the number of operations and amount of labor required in encapsulating the die is substantially reduced. Also, by utilizing film strip leads bonded to bumps on the die the leads do not require additional support from the encapsulation, as in most prior art devices.

It is an object of the present invention to provide an improved method of hermetically sealing a semiconductor die.

It is a further object of the present invention to provide an improved hermetically sealed semiconductor die wherein only the active surface is encapsulated.

It is a further object of the present invention to provide a method of hermetically sealing a semiconductor die wherein film strip leads are bonded to bump contacts on the die prior to, simultaneous with or subsequent to firing the encapsulating glass.

These and other objects of this invention will become apparent to those skilled in the art upon consideration of the accompanying specification, claims and drawings.

BRIEF DESCRIPTION OF THE DRAWINGS

Referring to the drawings, wherein like characters indicate like parts throughout the Figures.

DESCRIPTION OF THE PREFERRED EMBODIMENTS

Figure 1:
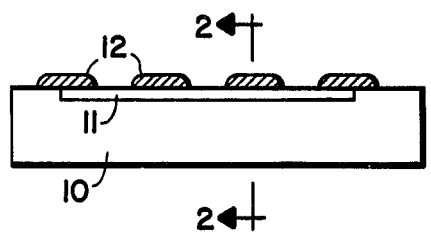
FIG. 1 is a view in side elevation of a semiconductor die.
Figure 2:
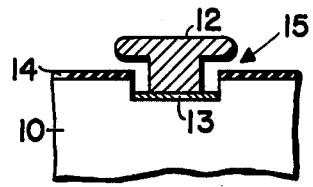
FIG. 2 is an enlarged sectional view as seen from the line 2—2 in FIG. 1, portions thereof removed.

Referring specifically to FIG. 1, a basic integrated circuit device, or semiconductor die 10, is illustrated. The semiconductor die, which in this embodiment is a silicon die, includes active circuitry 11 formed on the upper surface thereof, which in this disclosure will be referred to as the active surface. Also, a passivation layer of silicon oxide is formed over the active circuitry 11 to protect the active circuitry from the environment. A plurality of contact areas or pads are formed on the active surface of the semiconductor die 10 in contact with the active circuitry 11. The type of contact pads utilized in this disclosure are the type known as "bumps" which extend upwardly above the active circuitry so tht external leads may be easily attached thereto. The bumps are made of gold or copper and are gold plated to improve the contact therewith. Because each of the bumps 12 cannot be perfectly processed, a problem area may arise at the bump/die interface. Referring to FIG. 2, an enlarged section of the die 10 is illustrated showing a metallization layer 13, a passivation layer 14 and the bump/die interface 15. If the bump 12 is perfectly processed the passivation layer 14 will be in engagement with the side of the bump 12 so that there is no area therebetween for moisture to enter. However, since the bump 12 cannot always be perfectly processed an interface as illustrated in FIG. 2 may result in some or all bumps on a semiconductor die. When an interface 15 is formed as illustrated in FIG. 2, it is essential to encapsulate or hermetically seal the semiconductor die to render it impervious to moisture.

Figure 3:
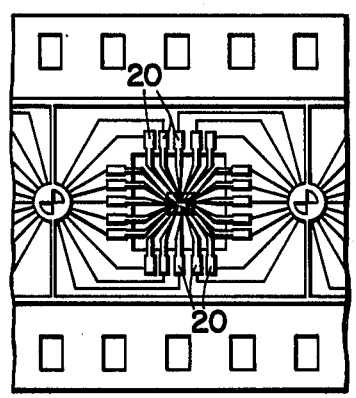
FIG. 3 is a view in top plan of a semiconductor die with film strip leads bonded thereto.

Referring to FIG. 3, a chip or semiconductor die 10 is illustrated with film strip leads 20 attached thereto. In this embodiment a plurality of sets of leads 20 are formed on a film strip by methods well known to those skilled in the art, which film strip may be referred to as a "lead frame", or a single set of contacts may be formed attached to an encircling lead frame, if desired. A set of leads 20 is then connected to a semiconductor die 10 as illustrated in FIG. 3 and the encapsulating process may be performed on the dies individually or in pluralities prior to disconnecting the lead frame from the leads. In general, the leads are formed of gold plated copper, similar to the bumps 12 and the leads 20 are connected to the bumps 12 by placing the leads 20 over the bumps 12, as illustrated in FIG. 3, and bringing a device called a "thermode" into contact therewith. The thermode has three thermo variables, temperature, pressure and dwell time, all of which are controlled to provide a proper bond between the leads 30 and the bump 12. By using the film strip leads 20, the leads are self supporting and do not require additional support from ceramic frames and the like as in prior art devices. Except for the encapsulation to render the semiconductor die 10 impervious to moisture, the semiconductor die illustrated in FIG. 3 is suitable for use as illustrated.

Figure 4:
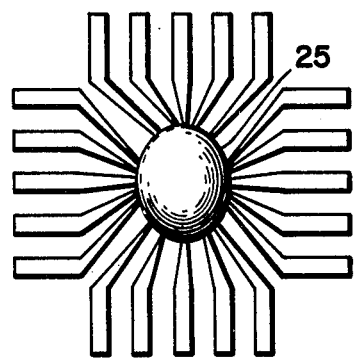
FIG. 4 is a view in top plan similar to FIG. 3 with the semiconductor die hermetically sealed by glass encapsulation.

To encapsulate the die 10 illustrated in FIG. 3, a thick mixture or slurry or unfired glass (which unfired glass is in the powdered form and may be suspended in water or other carrier) is utilized to coat the die 10 and the bonded leads. Water or other liquid carriers are baked out of the slurry after die coating and prior to melting of the glass. The glass selected should have a melting point below approximately 450° C. so that the heat required to fire the glass does not damage the lead bonds or reduce the life of the semiconductor die 10. In the present embodiment the glass selected was XS1175 made by Owen Illinois Inc. which glass melts in the 410° C.–420° C. region. While many types of apparatus and methods may be devised by those skilled in the art for firing the glass to produce a solid mass of glass encapsulating and hermetically sealing the active surface of the die 10 (including the active circuit and the bumps), in the present method the bottom of the die 10 was placed on a hot plate at 480° C. for three minutes. The final result is illustrated in FIG. 4 wherein a generally drop shaped solid mass of glass 25 is illustrated substantially encapsulating only the bump contact areas and the active surface of the die 10. While the encapsulating glass 25 adds some additional support to the leads 20, as explained previously, the leads do not require the extra support nor any additional packaging and the device illustrated in FIG. 4 is a complete package.

Figure 5:
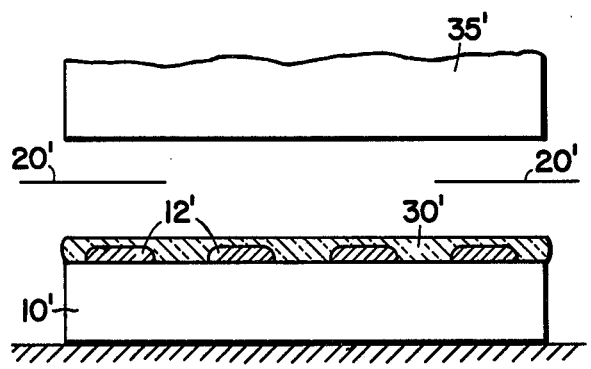
FIG. 5 is a view in side elevation, portions thereof removed, of apparatus for bonding leads to a semiconductor die.

In many instances, it may be desirable to bond the leads 20 to the bumps 12 of the die 10 and fire the encapsulating glass material at the same time. Referring to FIG. 5, a die 10' is illustrated having bumps 12' thereon for the connection of film strip leads 20'. In this particular method of encapsulating a thin glass coating 30' is placed over the active surface, including the bumps 12', of the die 10' prior to bonding of the leads 20'. The coating 30' may be a slurry of unfired glass, as described in conjunction with FIGS. 3 and 4. The film strip leads 20' are then placed in position over the bumps 12' and a hot thermode (for example a bonder made by Jade Inc., which is presently used for bonding leads to die bumps), designated 35' in FIG. 5, is utilized to simultaneously bond the film strip leads 20' to the bumps 12' and fire the glass 30' to encapsulate the active surface of the die 10' and the contact bonds thereon. Utilizing the Jade bonder, identified above, the desired lead bond and firing of the glass was accomplished with a machine pressure of 30 psig, a temperature of 600° C. and a dwell time of approximately 0.75 seconds. While those skilled in the art may devise alterations in these variables, depending upon the type of glass utilized and the contact bonds, these particular settings were satisfactory for the XS1175 glass and the described apparatus.

In some instances it may be desirable to bond the film strip leads to the bumps after the glass is fully or partially fired. To perform this method the apparatus in FIG. 5 may be utilized except that the glass 30' is fully or partially fired prior to placing the die 10' in the bonding machine 35'. The advantage of this method is that an entire IC wafer can be encapsulated and the various dies can then be cut from the wafer for the lead bonding operation. In this operation, the layer of fired glass 30' should be sufficiently thin so that the bonding machine 35' can melt the glass and provide a good contact for bonding between the film strip leads 20' and the bumps 12'. Once the leads 20' are bonded to the bumps 12' the bonding machine 35' is released and the glass layer 30' resolidifies to encapsulate the active surface of the die 10', including the bumps 12' thereon.

Accordingly, an improved method of hermetically sealing a semiconductor die is disclosed wherein leads in a lead frame or film strip are bonded to bumps on the die before, during or after encapsulating the active surface of the die by firing a glass slurry coated thereon. By utilizing leads which are self supporting when bonded to bumps on the semiconductor die, the encapsulating material does not need to support the leads and can be constructed much simpler. Also, since only the active surface of the die needs to be hermetically sealed, or impervious to moisture, the encapsulation process includes forming a solid mass of glass over only the active surface and the interface between the active surface and the bumps. Therefore, a substantially simplified method of hermetically sealing a semiconductor die is disclosed and a substantially cheaper and a simpler encapsulated semiconductor die results therefrom. While I have shown and described specific embodiments of this invention, further modifications and improvements will occur to those skilled in the art. I desire it to be understood, therefore, that this invention is not limited to the particular forms shown and I intend in the appended claims to cover all modifications which do not depart from the spirit and scope of this invention.

What is claimed is:

1. A method of hermetically sealing a semiconductor die comprising the steps of:
    (a) providing a semiconductor die having a plurality of contact pads thereon for receiving external leads in electrical connection therewith;
    (b) providing means having a plurality of inwardly directed leads formed as an integral portion thereof with the inner ends of said leads positioned to match, or mate, with the contact pads;
    (c) coating the die and contact pads with an unfired glass and firing the glass to form it into a solid mass encapsulating and hermetically sealing the die; and
    (d) positioning and bonding the leads of said means in mating engagement with the contact pads of the die utilizing sufficient heat to melt the glass encapsulating the contact pads to allow bonding of the leads to the contact pads and reencapsulating of the lead bonds.

2. A method as claimed in claim 1 wherein the first step includes providing a semiconductor die with bumps at the contact pads.

* * * * *